United States Patent
Grover et al.

(10) Patent No.: US 11,798,615 B2
(45) Date of Patent: Oct. 24, 2023

(54) HIGH DENSITY ARRAY, IN MEMORY COMPUTING

(71) Applicant: STMicroelectronics International N.V., Geneva (CH)

(72) Inventors: Anuj Grover, New Delhi (IN); Tanmoy Roy, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/721,956

(22) Filed: Apr. 15, 2022

(65) Prior Publication Data

US 2022/0238150 A1 Jul. 28, 2022

Related U.S. Application Data

(63) Continuation of application No. 16/994,488, filed on Aug. 14, 2020, now Pat. No. 11,335,397.

(60) Provisional application No. 62/891,692, filed on Aug. 26, 2019.

(51) Int. Cl.
*G11C 11/408* (2006.01)
*G11C 5/02* (2006.01)
*G11C 11/4091* (2006.01)
*G11C 11/4096* (2006.01)

(52) U.S. Cl.
CPC ......... *G11C 11/4085* (2013.01); *G11C 5/025* (2013.01); *G11C 11/4091* (2013.01); *G11C 11/4096* (2013.01)

(58) Field of Classification Search
CPC . G11C 11/4085; G11C 5/025; G11C 11/4091; G11C 11/4096

USPC ....................................................... 365/185.13
See application file for complete search history.

(56) References Cited

U.S. PATENT DOCUMENTS

| 5,477,489 A | 12/1995 | Wiedmann |
| 10,910,040 B2* | 2/2021 | Noel ..................... G11C 13/003 |
| 2009/0141566 A1 | 6/2009 | Arsovski |
| 2011/0026289 A1 | 2/2011 | Liaw |

(Continued)

OTHER PUBLICATIONS

Agrawal, et al., "X-SRAM: Enabling In-Memory Boolean Computations in CMOS Static Random Access Memories", *IEEE Transactions on Circuits and Systems I: Regular Papers*, 65(12): Dec. 2018, pp. 4219-4232.

*Primary Examiner* — Huan Hoang
(74) *Attorney, Agent, or Firm* — SEED INTELLECTUAL PROPERTY LAW GROUP LLP

(57) ABSTRACT

A memory cell that performs in-memory compute operations, includes a pair of cross-coupled inverters and a pair of transistors for selective performance of read/write/hold operations associated with logic states of the pair of cross-coupled inverters. The memory cell further includes a set of transistors that are gate coupled to and symmetrically arranged about the pair of cross coupled inverters. Output nodes of the memory cell are located at terminals of the set of transistors and provide output based on logic states of the pair of cross coupled inverters and input nodes provided between pairs of the set of transistors. A memory cell array may be generated having a high density arrangement memory cells that can perform in-memory compute operations. The memory cells can be arranged as a neural network including a set of memory cell networks that provide logic output operations based on logic states of the respective memory cells.

20 Claims, 7 Drawing Sheets

(56) References Cited

U.S. PATENT DOCUMENTS

| | | |
|---|---|---|
| 2018/0315473 A1 | 11/2018 | Yu et al. |
| 2019/0006375 A1 | 1/2019 | Morimoto et al. |
| 2019/0081050 A1 | 3/2019 | Liaw |
| 2019/0205095 A1 | 7/2019 | Gupta et al. |

* cited by examiner

HIGH DENSITY ARRAY, IN MEMORY COMPUTING

BACKGROUND

Technical Field

The present disclosure relates to the field of static random-access memory (SRAM) and, more particularly, to SRAM that performs in-memory computing.

Description of the Related Art

Machine learning and other computational applications involve performing systematic calculations on stored or streaming data. Multiply-accumulate (MAC) units have been used to enable such calculations on large scale over varying data sets. MAC units can be organized systematically to reduce interconnect lengths and achieve higher density arrays. In the context of SRAM, some previously-implemented technologies involved adding a MAC computation slice within an SRAM array structure to aid in processing. However, these solutions remain digital and involve full swing signal toggling, which can consume significant amounts of power. Although analog compute circuitry may be implemented to reduce the amount of power consumed, this circuitry also interrupts SRAM array structures thereby reducing array density.

One solution proposes using an eight transistor SRAM cell to implement an in-memory computing function. This solution is subject to low-voltage cell instability and other operational issues associated with dual port architectures. To date, designing stable low-power architecture for SRAM implementing in-memory computing has proven to be a difficult challenge.

BRIEF SUMMARY

The present disclosure includes embodiments of a memory cell having in-memory compute capabilities. The memory cell includes ten transistors that are arranged to facilitate data storage and perform logical operations. A first set of transistors of the memory cell store a first logic state and a complementary first logic state, and a second set of transistors are gate-coupled to the first set of transistors. A second logic state and a complementary second logic state are provided at nodes between adjacent pairs of the second set of transistors. The second set of transistors is coupled to output nodes that provide a set of outputs of the memory cell. Each output provided at the output notes corresponds to a logic operation involving two or more logic states selected from the first logic state, the complementary first logic state, the second logic state, and the complementary second logic state. The memory cell further facilitates reduction in vulnerability to data corruption.

The present disclosure further includes embodiments directed to layouts for the memory cell. The memory cell layouts include a set of active regions and a set of gate regions extending in directions transverse to each other. The layouts of the memory cell enable high density memory cell arrays to be constructed. The present disclosure also includes embodiments directed to neural networks comprising a plurality of memory cell networks that each includes a set of memory cells having in-memory compute capability and a sensing amplifier for generating an output based on detected small swing signals at outputs of the set of memory cells. Outputs of the memory cells may be coupled together to perform various combinations of logic operations.

DETAILED DESCRIPTION

The following description, along with the accompanying drawings, sets forth certain specific details in order to provide a thorough understanding of various disclosed embodiments. However, one skilled in the relevant art will recognize that the disclosed embodiments may be practiced in various combinations, without one or more of these specific details, or with other methods, components, devices, materials, etc. In other instances, well-known structures or components that are associated with the environment of the present disclosure, including but not limited to the communication systems and networks and the environment, have not been shown or described in order to avoid unnecessarily obscuring descriptions of the embodiments. Additionally, the various embodiments may be methods, systems, or devices. Accordingly, the various embodiments may be entirely hardware embodiments.

Throughout the specification, claims, and drawings, the following terms take the meaning explicitly associated herein, unless the context clearly dictates otherwise. The term "herein" refers to the specification, claims, and drawings associated with the current application. The phrases "in one embodiment," "in another embodiment," "in various embodiments," "in some embodiments," "in other embodiments," and other variations thereof refer to one or more features, structures, functions, limitations, or characteristics of the present disclosure, and are not limited to the same or different embodiments unless the context clearly dictates otherwise. As used herein, the term "or" is an inclusive "or" operator, and is equivalent to the phrases "A or B, or both" or "A or B or C, or any combination thereof," and lists with additional elements are similarly treated. The term "based on" is not exclusive and allows for being based on additional features, functions, aspects, or limitations not described, unless the context clearly dictates otherwise. In addition, throughout the specification, the meaning of "a," "an," and "the" include singular and plural references.

References to the term "set" (e.g., "a set of items"), as used herein, unless otherwise noted or contradicted by context, is to be construed as a nonempty collection comprising one or more members or instances.

The term "node," as used herein, refers to a point in a circuit at which terminals of two or more circuit elements are connected or can be connected. Unless otherwise noted or contradicted by context, a node is understood to refer to a point in a circuit external to a circuit element.

Figure 1:
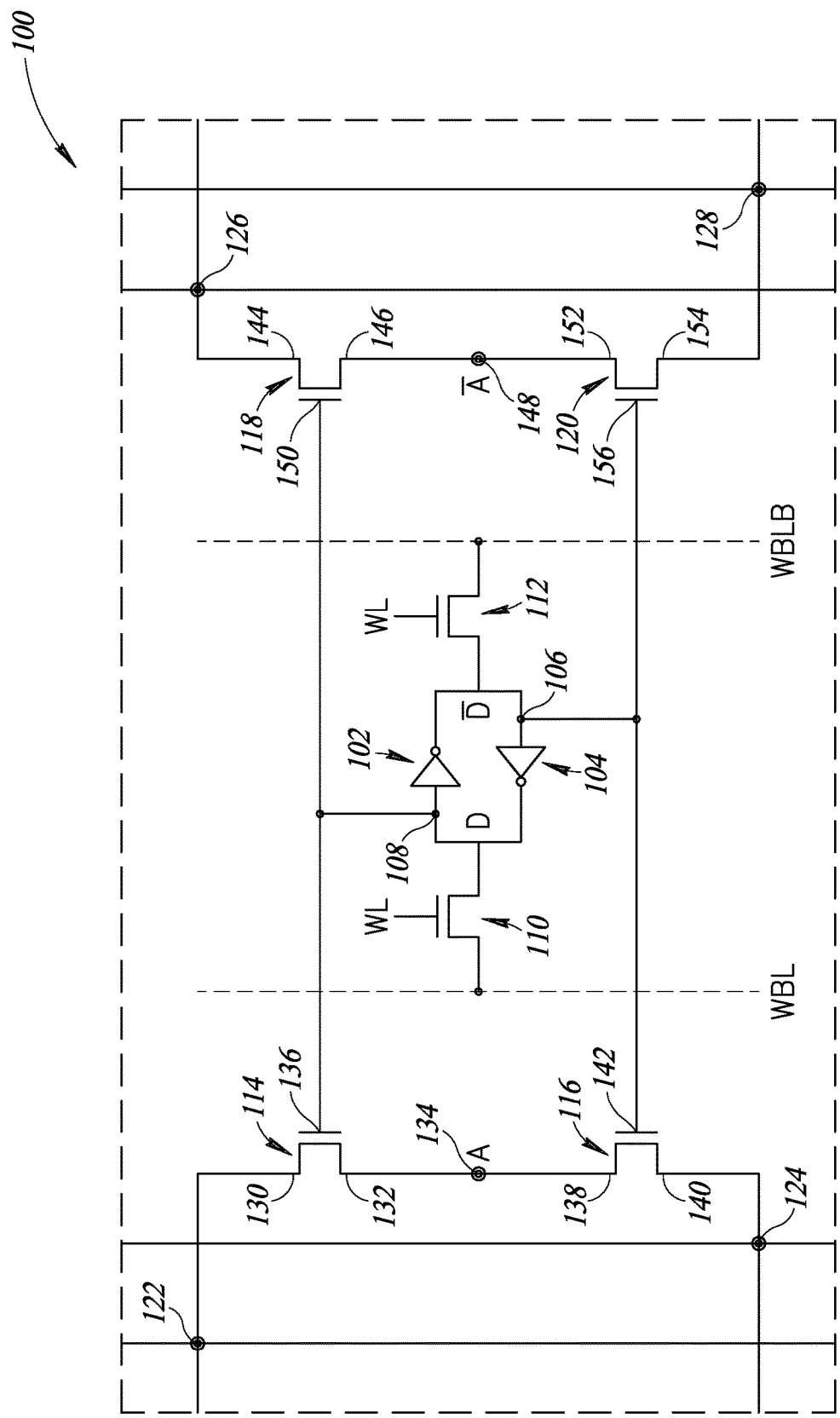
FIG. 1 shows a schematic diagram of a memory cell according to one or more embodiments.

FIG. 1 shows a schematic of an SRAM cell 100 having in-memory compute capability according to one or more embodiments. The SRAM cell 100 includes ten transistors (10 T) that are arranged to facilitate data storage and in-memory compute capabilities. The memory cell 100 comprises a first inverter 102 and a second inverter 104 cross-coupled with each other. In particular, an output of the first inverter 102 is coupled to an input of the second inverter 104 at a first node 106 of the SRAM cell 100, and an output of the second inverter 104 is coupled to an input of the first inverter 102 at a second node 108 of the cell 100.

The first inverter 102 and the second inverter 104 may each be complementary metal oxide semiconductor field effect transistor (CMOS) inverters that include a pair of complementary transistors (e.g., one p-type, one n-type) having commonly coupled gates as an input node, and an output node at a source terminal to drain terminal connection between the pair of transistors. The first inverter 102 thus includes a first transistor and a second transistor of the memory cell 100 and the second inverter 104 thus includes a third transistor and a fourth transistor of the memory cell 100. Other inverter topologies may be used to implement the first and second inverters 102 and 104, such as transistor-to-transistor logic or other logic gate architectures, which may employ different types of transistors or more transistors.

The first inverter 102 and the second inverter 104 form a storage element for storing a logic state D and a complementary logic state $\overline{D}$ of the memory cell 100. The logic state D and the complementary logic state $\overline{D}$ collectively correspond to a bit of data stored by the memory cell 100. The memory cell 100 also includes a fifth transistor 110 and a sixth transistor 112 for selectively reading data from or writing data to the logic state D and the complementary logic state $\overline{D}$. The fifth transistor 110 has a first terminal coupled to the second node 108, a second terminal coupled to a bit line BL, and a gate terminal coupled to a word line WL. The sixth transistor 112 has a first terminal coupled to the first node 106, a second terminal coupled to a complementary bit line BLB, and a gate terminal coupled to the word line WL. A logic state of data on the complementary bit line BLB is inverted with respect to a logic state of data on the bit line BL.

The memory cell 100 includes a set of internal gate coupled transistors located symmetrically around the first inverter 102, the second inverter 104, the fifth transistor 110, and the sixth transistor 112. Specifically, the memory cell 100 includes a seventh transistor 114 and an eighth transistor 116 coupled in series between a first output node 122 and a second output node 124 of the memory cell 100. The memory cell 100 also includes a ninth transistor 118 and a tenth transistor 120 coupled in series between a third output node 126 and a fourth output node 128 of the memory cell 100. The memory cell 100 may provide a different logic output at each of the output nodes 122, 124, 126, and 128 based on a logic state of other nodes in the memory cell 100, as described below in greater detail.

The seventh transistor 114 has a first terminal 130 coupled to the first output node 122, a second terminal 132 coupled to a third node 134 of the memory cell 100, and a gate terminal 136 coupled to the second node 108. The seventh transistor has a first node 138 coupled to the third node 134, a second terminal 140 coupled to the second output node 124, and a gate terminal 142 coupled to the first node 106. The third node 134 defines a node between commonly coupled second terminal 132 of the seventh transistor 114 and the first terminal 138 of the eighth transistor 116. A second logic state A is provided at the third node 134, which may be independent of the logic state D and the complementary logic state $\overline{D}$.

The ninth transistor 118 has a first terminal 144 coupled to the third output node 126, a second terminal coupled to a fourth node 148, and a gate terminal 150 coupled to the second node 108. The tenth transistor 120 has a first terminal 152 coupled to the fourth node 148, a second terminal 154 coupled to the fourth output node 128, and a gate terminal 156 coupled to the first node 106. A complementary second logic state $\overline{A}$ is provided at the fourth node 148 and has a logic state that is the inverse of the second logic state A.

The seventh transistor 114, the eighth transistor 116, the ninth transistor 118, and the tenth transistor 120 perform gate coupled operations, which provides numerous benefits. Specifically, the gate terminals 136 and 150 respectively of the seventh transistor 114 and the ninth transistor 118 are commonly coupled to the second node 108 of the memory cell 100. The gate terminals 142 and 156 respectively of the eighth transistor 116 and the tenth transistor 120 are commonly coupled to the first node 106 of the memory cell 100. Coupling the gate terminals of the transistors to internal nodes of the memory cell 100, rather than exposing the gate terminals for external access, improves the robustness of the memory cell 100 by facilitating reduction in vulnerability to data corruption.

The logic state of the second logic state A may be selectively controlled (and the complementary second logic state $\overline{A}$ as a result) by input to the memory cell 100. In some embodiments, the memory cell 100 may include one or more inputs for controlling the logic state of the second logic state A and complementary second logic state $\overline{A}$. The third node 134 and the fourth node 148 may be respectively coupled to one or more lines over which voltage signals are provided to drive the logic levels for the second logic state A and complementary second logic state $\overline{A}$. In some embodiments, the second logic state A and the complementary second logic state $\overline{A}$ may be controlled by an associated system, such as a neural network or machine learning system. In some embodiments, the second logic state A and the complementary second logic state $\overline{A}$ may correspond to logic state(s) stored by another memory cell in an array of memory cells that include the memory cell 100. For instance, the second logic state A and the complementary second logic state $\overline{A}$ may correspond to logic states of an adjacent memory cell to the memory cell 100.

The first output node 122, the second output node 124, the third output node 126, and the fourth output node 128 each provide logic output based on a combination of one or more logic states of the logic state D, the complementary logic state $\overline{D}$, the second logic state A, and complementary second logic state $\overline{A}$. The output of the memory cell 100 at the first output node 122 may be $\overline{A \cdot D}$, which has the following truth table, where Q is the output at the first output node 122:

| A | D | Q |
|---|---|---|
| 0 | 0 | 1 |
| 0 | 1 | 0 |
| 1 | 0 | 1 |
| 1 | 1 | 1 |

The output of the memory cell 100 at the second output node 124 may be A+D, which has the following truth table, where Q is the output at the second output node 124:

| A | D | Q |
|---|---|---|
| 0 | 0 | 0 |
| 0 | 1 | 1 |
| 1 | 0 | 1 |
| 1 | 1 | 1 |

The output of the memory cell 100 at the third output node 126 may be $\overline{A \cdot D}$, which has the following truth table, where Q is the output at the third output node 126:

| A | D | Q |
|---|---|---|
| 0 | 0 | 1 |
| 0 | 1 | 1 |
| 1 | 0 | 1 |
| 1 | 1 | 0 |

The output of the memory cell 100 at the fourth output node 128 may be $\overline{A \cdot \overline{D}}$, which has the following truth table, where Q is the output at the fourth output node 128:

| A | D | Q |
|---|---|---|
| 0 | 0 | 1 |
| 0 | 1 | 1 |
| 1 | 0 | 0 |
| 1 | 1 | 1 |

The foregoing logic outputs are non-limiting examples of the myriad logic operations that can be implemented via the structure of the memory cell 100. The logic operations performed by the memory cell 100 may be modified by changing the transistor type of the seventh transistor 114, the eighth transistor 116, the ninth transistor 118, or the tenth transistor 120. Different nodes of the memory cell 100 can be connected together to perform other logic operations. For instance, the first output node 122 and the fourth output node 128 may be connected together to perform an exclusive OR (XOR) operation involving the logic state D and the second logic state A. The XOR operation has the following truth table provided from an output node at which the first output node 122 and the fourth output node 128 are directly coupled together:

| A | D | Q |
|---|---|---|
| 0 | 0 | 0 |
| 0 | 1 | 1 |
| 1 | 0 | 1 |
| 1 | 1 | 0 |

As another example, the second output node 124 and the third output node 126 may be connected together to perform an exclusive NOR (XNOR) operation involving the logic state D and the second logic state A. The XNOR operation has the following truth table provided from an output node at which the second output node 124 and the third output node 126 are directly coupled together:

| A | D | Q |
|---|---|---|
| 0 | 0 | 1 |
| 0 | 1 | 0 |
| 1 | 0 | 0 |
| 1 | 1 | 1 |

Those of ordinary skill in the art will appreciate that other logic operations, such as NAND operations, may be achieved by coupling three or more of the output nodes, such as the first output node 122, the second output node 124, and the fourth output node 128.

The structure of the memory cell 100 also facilitates low power consumption while enabling performance of multiple types of in-memory compute logic operations. For instance, small voltage swings can be used to perform the in-memory compute logic operations in the memory cell 100, which reduces power consumption in comparison with other SRAM architectures.

In some embodiments, all of the transistors of the memory cell 100 are MOSFET transistors. In such embodiments, the MOSFET transistors may be all of the same type (e.g., N-type MOSFET, P-type MOSFET) or some may be different. For example, the first transistor of the first inverter 102 may be a P-type transistor and the second transistor of the first inverter 102 may be an N-type transistor. The third transistor of the second inverter 104 may be a P-type transistor and the fourth transistor of the second inverter 104 may be an N-type transistor. The fifth transistor 110 and the sixth transistor 112 are of the same type (e.g., both N-type, both P-type) presuming that the word lines WL connected to each correspond to the same line (i.e., provide the same logic state).

The types of the seventh transistor 114, the eighth transistor 116, the ninth transistor 118, and the tenth transistor 120 may vary depending on the desired logic output from the first to fourth output nodes 122, 124, 126, and 128. As one non-limiting example, the seventh transistor 114 and the ninth transistor 118 may be of the same MOSFET type (e.g., both N-type, both P-type), and the eighth transistor 116 and the tenth transistor 120 may be of the same type that is different than the type of transistor of the seventh and ninth transistors 114 and 118. Those skilled in the art will understand that different types of transistors may be implemented to achieve different in-memory computing functions (e.g., NAND, XNOR, XOR) without departing from the scope of the present disclosure.

Figure 2:
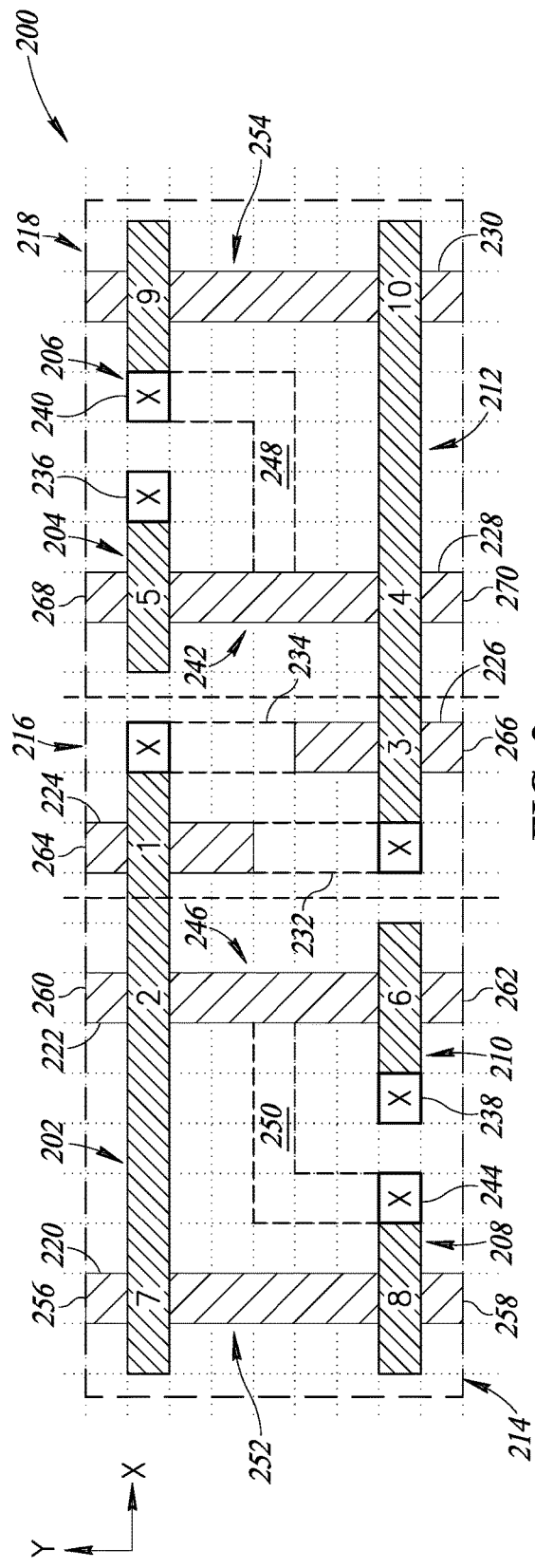
FIG. 2 shows a first layout of the memory cell of FIG. 1 according to one or more embodiments.

FIG. 2 shows a first memory cell layout 200 corresponding to the memory cell 100 according to one or more embodiments. The first memory cell layout 200 includes a plurality of active regions extending linearly in directions parallel to a first axis (vertically in FIG. 2) and a plurality of gate regions extending linearly in directions transverse to the first axis (horizontally in FIG. 2). Each of the gate regions may be layers of polysilicon or a combination of polysilicon and other materials, such as silicides (e.g., cobalt silicide, tantalum silicide, tungsten silicide). The active regions are diffusion layers having a p-type or n-type depending on the desired operation of the memory cell 100. Each of the active regions crosses and overlays one or more of the gate regions to form transistors that comprise the memory cell 100. Some of the active regions and/or some of the gate regions may vary in width and/or thickness along their length.

The term "overlay," as used herein, refers to an arrangement of at least a first member and a second member in which an axis intersects with a portion of the first member intersects and a portion of the second member. The overlaying portion of the first member and the portion of the second member may be spaced apart from each other along the axis. For example, the first member and the second member may not be in contact to be considered as being overlaying.

The gate regions include a first set of gate regions extending along a first direction (e.g., in parallel with the x-axis shown in FIG. 2). The first set of gate regions include a first gate region 202, a second gate region 204, and a third gate region 206 extending along the first direction and being spaced apart from each other along the first direction. The gate regions also include a second set of gate regions extending along the first direction (e.g., in parallel with the x-axis shown in FIG. 2). The second set of gate regions include a fourth gate region 208, a fifth gate region 210, and a sixth gate region 212 extending along the first direction and being spaced apart from each other along the first direction. The first set of gate regions is spaced apart from the second set of gate regions in the second direction (e.g., in parallel with the y-axis shown in FIG. 2). Although the gate regions are shown as being coaxial with each other, some of the gate regions may instead be misaligned with other gate regions without departing from the scope of the instant disclosure.

The active regions include a first set of active regions extending in the second direction in a first area 214 of the first memory cell layout 200. The first set of active regions include a first active region 220 and a second active region 222 spaced apart from the first active region 220 in the first direction. The set of active regions include a second set of active regions extending in the second direction in a second area 216 that is adjacent to the first area 214 in the first direction. The second set of active regions include a third active region 224 and a fourth active region 226 spaced apart from the third active region 224 in the first direction. The set of active regions further include a third set of active regions extending in the second direction and the third area 218 that is adjacent to the second area 216 in the first direction. The third set of active regions include a fifth active region 228 and a sixth active region 230 spaced apart from the fifth active region 228 in the first direction.

Transistors are formed in the first memory cell layout 200 at locations where a gate region overlays with an active region. The first transistor of the first inverter 102 is formed at an overlay between the third active region 224 and the first gate region 202. The second transistor of the first inverter 102 is formed at an overlay between the second active region 222 and the first gate region 202. The third transistor of the second inverter 104 is formed at an overlay between the fourth active region 226 and the sixth gate region 212. The fourth transistor of the second inverter 104 is formed at an overlay between the fifth active region 228 and the sixth gate region 212. The fifth transistor 110 is formed at an overlay between the second gate region 204 and the fifth active region 228. The sixth transistor 112 is formed at an overlay between the fifth gate region 210 and the second active region 222.

The first set of active regions (i.e., in the first area 214) extend entirely between the first set of gate regions and the second set of gate regions. That is, the first active region 220 extends entirely between and overlays the first gate region 202 and the fourth gate region 208, and the second active region 222 extends entirely between and overlays the first gate region 202 and the fifth gate region 210. The third set of active regions (i.e., in the third area 218) also extend entirely between the first set of gate regions and the second set of gate regions. The fifth active region 228 extends entirely between and overlays the second gate region 204 and the sixth gate region 212, and the sixth active region 230 extends entirely between and overlays the third gate region 206 and the sixth gate region 212.

The second set of active regions (i.e., and the second area 216) extend partially between the first set of gate regions and the second set of gate regions. That is, the third active region 224 extends from the first gate region 202 toward the sixth gate region 212 but does not overlay the sixth gate region 212. The fourth active region 226 extends from the sixth gate region 212 toward the first gate region 202 but does not overlay the first gate region 202. A first metal region 232 is electrically coupled to an end portion of the third active region 224 and electrically couples with an end portion of the sixth gate region 212. A second metal region 234 is electrically coupled to an end portion of the fourth active region 226 and is electrically coupled to an end portion of the first gate region 202. The first metal region 232 and the second metal region 234 serve to cross couple the first inverter 102 and the second inverter 104. The first metal region 232 and the second metal region 234 may be formed on a different layer than the active regions and the gate regions. The first metal region 232 and the second metal region 234 may be electrically coupled through vias extending through one or more layers of the first memory cell layout 200.

The seventh transistor 114 is formed at an overlay between the first gate region 202 and the first active region 220. The eighth transistor 116 is formed at an overlay between the fourth gate region 208 and the first active region 220. The ninth transistor is formed at an overlay between the third gate region 206 and the sixth active region 230. The tenth transistor 120 is formed at an overlay between the sixth gate region 212 and the sixth active region 230.

An end portion 236 of the second gate region 204 and an end portion 238 of the fifth gate region 210 may be electrically coupled to a word line for controlling a read/write/hold state of the pair of cross-coupled inverters. An end portion 240 of the third gate region may be electrically coupled to the medial portion 242 of the fifth active region 228 that is between the second gate region 204 and the sixth gate region 212. An end portion 244 of the fourth gate region 208 may be electrically coupled to a medial portion 246 of the second active region 222 that is between the first gate region 202 and the fifth gate region 210. A third metal region 248 may connect the end portion 240 of the third gate region 206 to the medial portion 242 of the fifth active region 228 in a layer other than the active regions in the gate regions. A fourth metal region 250 may connect the end portion 244 of the fourth gate region 208 to the medial portion 246 of the second gate region 204 in a layer other than the active regions in the gate regions. The third metal region 248 and the fourth metal region 250 may have a bent shape that extends in both the first direction and the second direction.

A medial portion 252 of the first active region 220 corresponds to the third node 134 described above with respect to FIG. 1. A medial portion 254 of the sixth active region 230 corresponds to the fourth node 148 described with respect to FIG. 1. A contact may be provided at the medial portion 252 for electrically coupling a signal corresponding to the second logic state A and a contact may be provided at the medial portion 254 for electrically coupling a signal corresponding to the complementary second logic state $\overline{A}$.

The end portions of the active regions may be connected according to the structures described with respect to the memory cell 100. An example scheme of how the end portions of the active regions may be connected will now be provided; however, this scheme may be adjusted according to the transistor types, desired output logic, etc. A first end portion 256 of the first active region 220 corresponds to the first output node 122 and a second end portion 258 of the first active region 220 corresponds to the second output node 124. A first end portion 260 of the second active region 222 corresponds to a voltage potential connection (e.g., VDD, GND), and a second end portion 262 of the second active region corresponds to a bit line input connection (e.g., bit line BL, complementary bit line BLB). A first end portion 264 of the third active region 224 corresponds to a voltage potential connection (e.g., VDD, GND). A second end portion 266 of the fourth active region 226 also corresponds to a voltage potential connection (e.g., VDD, GND). A first end portion 268 of the fifth active region 228 corresponds to a bit line input connection (e.g., bit line BL, complementary bit line BLB), and a second end portion 270 of the fifth active region 228 corresponds to a voltage potential connection (e.g., VDD, GND). A first end portion 272 of the sixth active region 230 corresponds to the third output node 126, and a second end portion 274 of the sixth active region 230 corresponds to the fourth output node 128.

Figure 3:
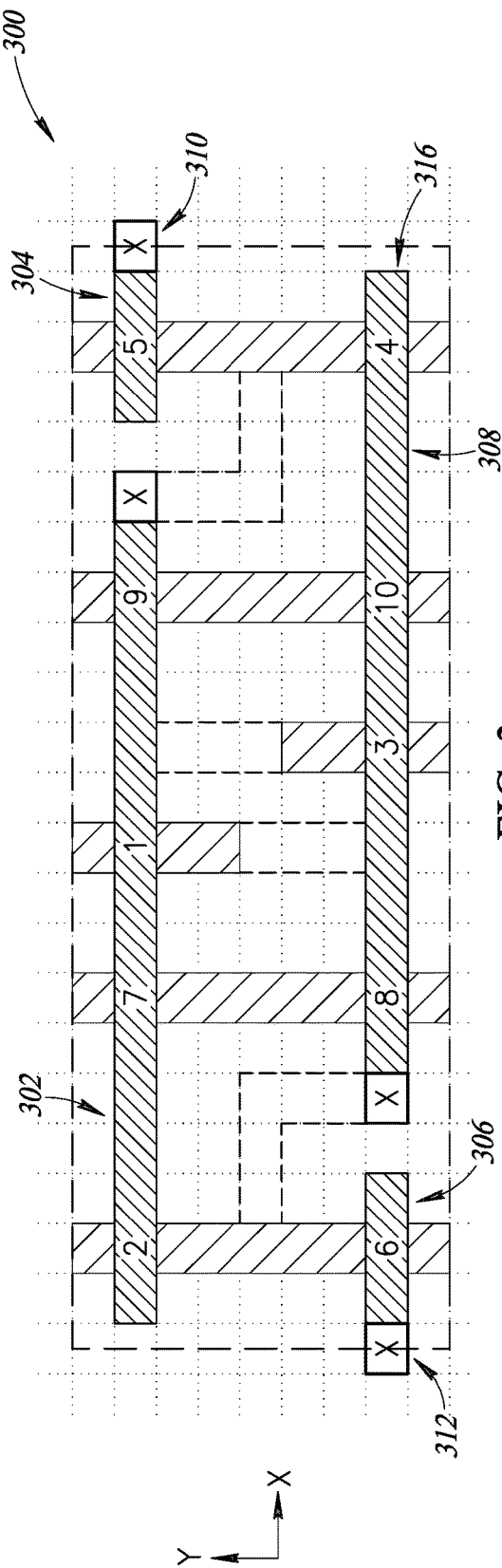
FIG. 3 shows a second layout of the memory cell of FIG. 1 according to one or more embodiments.

FIG. 3 shows a second memory cell layout 300 corresponding to the memory cell 100 according to one or more embodiments. The second memory cell layout 300 operates in the same manner as described with respect to the memory cell 100, but has a denser layout than the first memory cell layout 200. In particular, in the second memory cell layout 300, the active regions and the gate regions of the first area 214 are transposed about the y-axis relative to the first memory cell layout 200, and the active regions and gate regions of the third area 218 are transposed about the y-axis relative to the first memory cell layout 200 (see FIG. 2). As a result, spaces between gate regions in adjacent areas can be eliminated such that the number of distinct gate regions can be reduced and the cell layout can be compressed in the first direction. Thus, the overall size of the memory cell layout is reduced and the density memory cell array having an in-memory compute capability can be increased.

In the second memory cell layout 300, there is a first gate region 302 extending in the first direction (in a direction parallel with the x-axis) and a second gate region 304 extending the first direction and spaced apart from the first gate region 302 in the first direction. A third gate region 306 and a fourth gate region 308 extend in the first direction and are spaced apart from the first gate region 302 and the second gate region 304 in the second direction (in a direction parallel with the y-axis). The third gate region 306 and the fourth gate region 308 are spaced apart from each other in the second direction. As a result, the gate region corresponding to the ninth transistor 118 is part of the same gate region as the gate region corresponding to the first transistor of the first inverter 302. Also, the gate region corresponding to the eighth transistor 116 is part of the same gate region as the gate region corresponding to the third transistor of the second inverter 104.

The second memory cell layout 300 also has connection points provided at end portions thereof in the first direction to facilitate sharing connections of lines between adjacent memory cells. The second gate region 304 and the third gate region 306 respectively correspond to the fifth transistor 110 and the sixth transistor 112 discussed with respect to the memory cell 100. The second gate region 304 has an end portion 310 for connection of a word line WL for controlling write/read/hold operation of the fifth transistor 110. The third gate region 306 has an end portion 312 for connection of a word line WL for controlling write/read/hold operation of the sixth transistor 112. By facilitating connection between adjacent cells through a shareable word line WL at end portions of the second gate region 304 and the third gate region 306 instead of through internal nodes of a cell, the overall area of a memory array can be reduced by reducing distances between adjacent memory cells.

With the exception of the transposed active regions of the second memory cell layout 300 compared to the first memory cell layout 200, the remaining layout of the second memory cell layout 300 is substantially similar to the first memory cell layout 200 so further description thereof is omitted for brevity.

Figure 4:
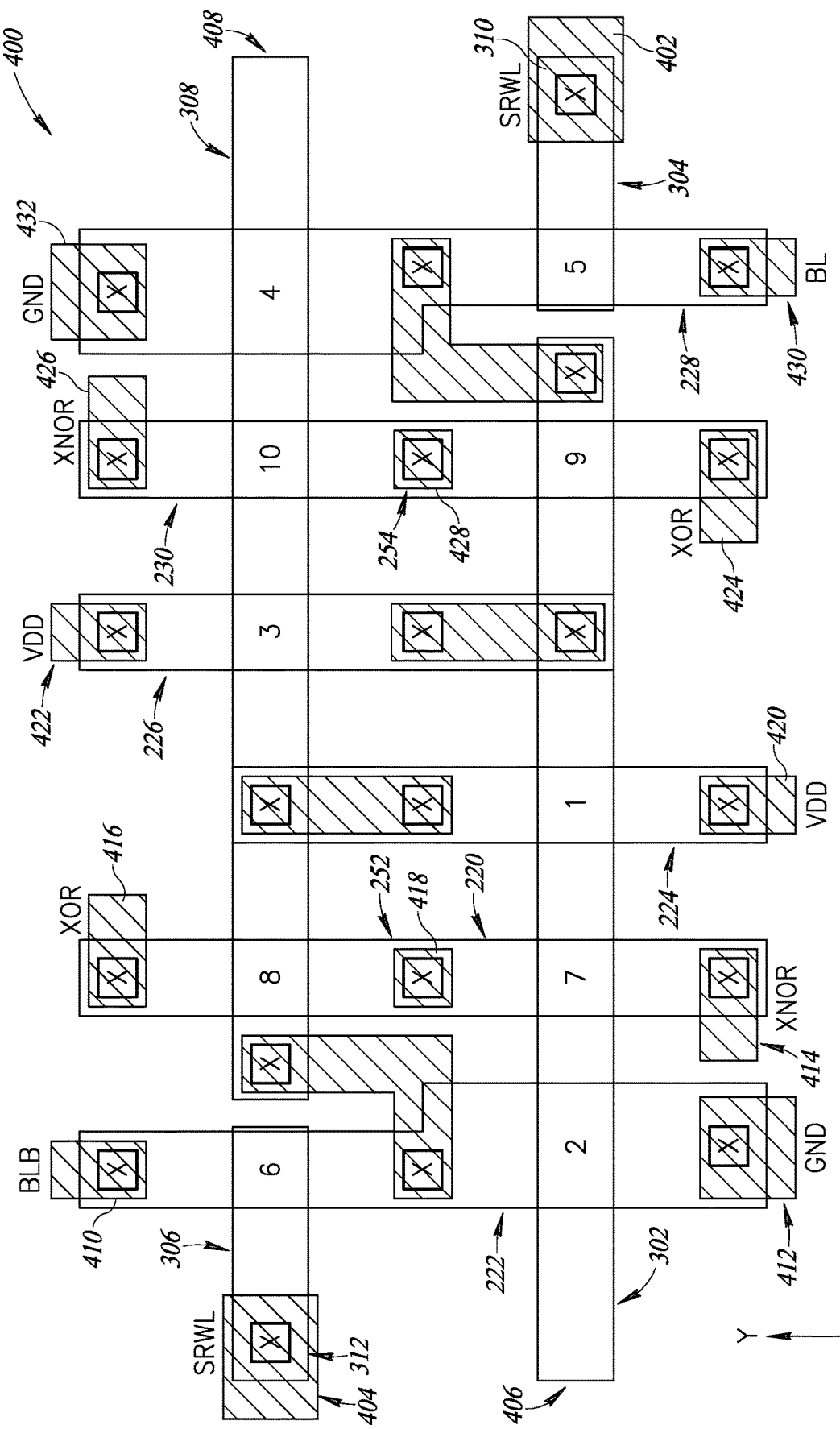
FIG. 4 shows a connection diagram of the second layout of FIG. 3 according to one or more embodiments.

FIG. 4 shows a connection diagram 400 of the second memory cell layout 300 according to one or more embodiments. The connection diagram 400 includes the same features described above with respect to the second memory cell layout 300 and detailing how the active regions and the gate regions may be connected to particular signals. The connection diagram 400 is intended to be an example of how the second memory cell layout 300 may be connected and is not intended to be limiting.

The end portion 310 of the second gate region 304 may be coupled to a sharable word line contact 402 of the second memory cell layout 300. The sharable word line contact 402 is coupled to the word line WL for controlling write/read/hold operation of the memory cell 100. The sharable word line contact 402 may be coupled to or commonly connected to a sharable word line contact of an adjacent memory cell having the second memory cell layout 300. The word line WL to which the sharable word line contact 402 is connected extends in a layer of the memory cell layout not shown.

The end portion 312 of the third gate region 306 may be coupled to a shareable word line contact 404 of the second memory cell layout 300. The shareable word line contact 404 is also coupled to the word line WL for controlling write/read/hold operation of the memory cell 100. The shareable or line contact 404 may be coupled to or commonly connected to a shareable word line contact of an adjacent memory cell, as described above. Commonly coupling shareable word lines between adjacent memory cells facilitates a denser array layout of memory cells to be achieved.

End portions 406 and 408 respectively of the first gate region 302 and the fourth gate region 308 are spaced apart in the first direction from gate regions of adjacent memory cells in the first direction.

The second active region 222 extends in the second direction below the first gate region 302 and above the third gate region 306. Above the third gate region 306, the second gate region 222 extends to couple to the complement bit line BLB via a first bit line connection 410. The second gate region 222 extends below the first gate region 302 and the second direction to connect to a first ground connection 412 that is coupled to a ground GND of the memory cell 100.

The first active region 220 extends in a second direction below the first gate region 302 and above the fourth gate region 308. The portion of the first active region 220 that extends below the first gate region 302 is coupled to a first output connection 414 corresponding to the first output node 122 of the memory cell 100. The portion of the first active region 220 that extends above the fourth gate region 308 and the second direction is coupled to a second output connection 416 corresponding to the second output node 124 of the memory cell 100. The medial portion 252 of the first active region 220 is coupled to a first input connection 418 corresponding to the third node 134 of the memory cell 100. The first input connection 418 is coupled to a line in a different layer than the first active region 220 in at least some embodiments.

The third active region 224 shown in the connection diagram 400 extends in the second direction below the first gate region 302 and is coupled to a first supply voltage connection 420 for receiving supply voltage for the memory cell 100. The fourth active region 226 shown in the connection diagram 400 extends in the second direction above the fourth gate region 308 and is coupled to a second supply voltage connection 422 for receiving the supply voltage.

The sixth active region 230 extends in the second direction above the fourth gate region 308 and below the first gate region 302. The portion of the sixth active region 230 extending below the first gate region 302 is coupled to a third output connection 424 corresponding to the third output node 126. The portion of the six active region 230 extending above the fourth gate region 308 is coupled to a fourth output connection 426 corresponding to the fourth output node 128. The medial portion 254 of the sixth active region 230 is coupled to a second input connection 428 corresponding to the fourth node 148 of the memory cell 100.

The fifth active region 228 extends in the second direction above the fourth gate region 308 and below the second gate region 304. The portion of the fifth active region 228 extending below the second gate region 304 is coupled to a second bit line connection 430. The portion of the fifth active region 220 that extends above the fourth gate region 308 is coupled to a second ground connection 432.

The second output connection 416 and the third output connection 424 may be commonly coupled together (e.g., short-circuited) to generate an XOR output, as described above. A differential XOR output may be generated by connecting the second output connection 416 and the third output connection 424 to differential inputs of a sensing amplifier. The first output connection 414 and the fourth output connection 426 may be commonly coupled together to generate an XNOR output, as described above. A differential XNOR output may be generated by connecting the first output connection 414 and the fourth output connection 426 to differential inputs of the sensing amplifier. Different output connections may be commonly coupled by metal lines extending in another layer of the memory cell layout.

Figure 5:
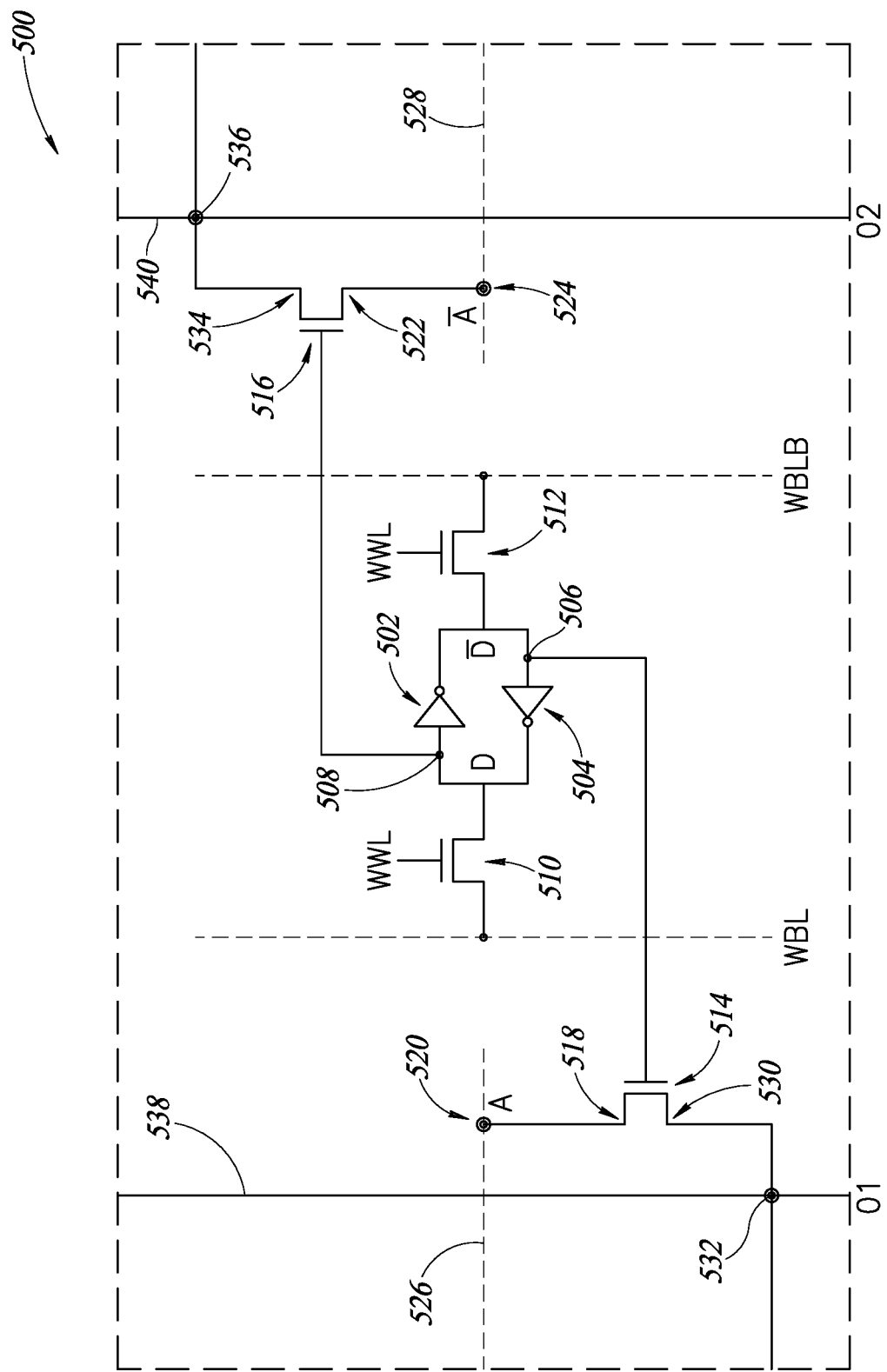
FIG. 5 shows a second schematic diagram of a memory cell according to one or more embodiments.

FIG. 5 shows a schematic of an SRAM having in-memory compute capability according to one or more embodiments. The SRAM cell 500 includes eight transistors (18) that are arranged to facilitate data storage and in-memory compute capabilities. The memory cell 500 comprises a first inverter 502 and the second inverter 504 cross-coupled with each other as described above with respect to the memory cell 100. The first inverter 502 includes a first transistor and a second transistor of the memory cell 500 coupled in series with each other. The second inverter 504 includes a third transistor in fourth transistor of the memory cell 500 coupled in series with each other.

The memory cell 500 includes a first node 506 located the tween an output of the first inverter 502 and an input of the second inverter 504, and also includes a second node 508 located between an input of the first inverter 502 and an output of the second inverter 504, as described above with respect to the memory cell 100. The second node 508 stores a bit of data corresponding to a first logic state D and the first node 506 stores a bit of data corresponding to a complementary first logic state $\overline{D}$, as also described with respect to the memory cell 100.

The SRAM cell 500 further includes a fifth transistor 510 and the sixth transistor 512 respectively coupled to the second node 508 and the first node 506. The fifth transistor 510 has a first terminal coupled to a right bit line WBAL and a gate terminal coupled to a right word line WWL. The sixth transistor 512 has a first terminal coupled to a complementary write bit line W BLB into gate terminal coupled to the right word line WWL.

The SRAM cell 500 further includes a seventh transistor 514 gate coupled to the first node 506 and includes an eighth transistor 516 gate coupled to the second node 508. A first terminal 518 of the seventh transistor is coupled to a third node 520 of the memory cell 500 that provides an input corresponding to a second logic state A of the memory cell 500. The eighth transistor 516 has a first terminal 522 coupled to a fourth node 524 of the memory cell 500 that provides an input corresponding to a complementary second logic state $\overline{A}$. The third node 520 may be coupled to a first input line 526 for driving a logic state of the third node 520. The fourth node 524 may be coupled to a second input line 528 for driving a logic state of the fourth node 524.

The seventh transistor 514 also includes a second terminal 530 coupled to a first output node 532 of the SRAM cell 500 the eighth transistor 516 also includes a second terminal 534 coupled to a second output node 536 of the SRAM cell 500. The first output node 532 may be coupled to a first output line 538 four providing output from the first output node 532, and the second output node 536 may be coupled to a second output line 540. The first output node 532 and the second output node 536 may each provide logic output based on a combination of one or more logic states of the logic state D, the complementary logic state $\overline{D}$, the second logic state A, and complementary second logic state $\overline{A}$. For example, the output of the memory cell 500 at the first output node 532 may be A+D, which has the following truth table, were Q is the output at the first output node 532:

| A | D | Q |
|---|---|---|
| 0 | 0 | 0 |
| 0 | 1 | 1 |
| 1 | 0 | 1 |
| 1 | 1 | 1 |

The output of the memory cell 500 at the second output node 536 may be $\overline{A \cdot D}$, which has the following truth table, where Q is the output at the second output node 536:

| A | D | Q |
|---|---|---|
| 0 | 0 | 1 |
| 0 | 1 | 1 |
| 1 | 0 | 1 |
| 1 | 1 | 0 |

As described above with respect to the memory cell 100, the foregoing logic outputs are non-limiting examples of the myriad logic operations that can be implemented via the structure of the SRAM cell 500. Those skilled in the art may appreciate that different logic operations can be performed involving the first logic state and the second logic state (or complements thereof) based on various aspects of the SRAM cell 500. The outputs of the SRAM cell 500 may be coupled together to perform other logic operations—for example the first output node 532 and the second output node 536 may be coupled together to perform an exclusive NOR (XNOR) operation involving the first logic state D and the second logic state A. The XNOR operation has the following truth table provided from an output node at which the first output node 532 and the second output node 536 are directly coupled together:

| A | D | Q |
|---|---|---|
| 0 | 0 | 1 |
| 0 | 1 | 0 |
| 1 | 0 | 0 |
| 1 | 1 | 1 |

Figure 6:
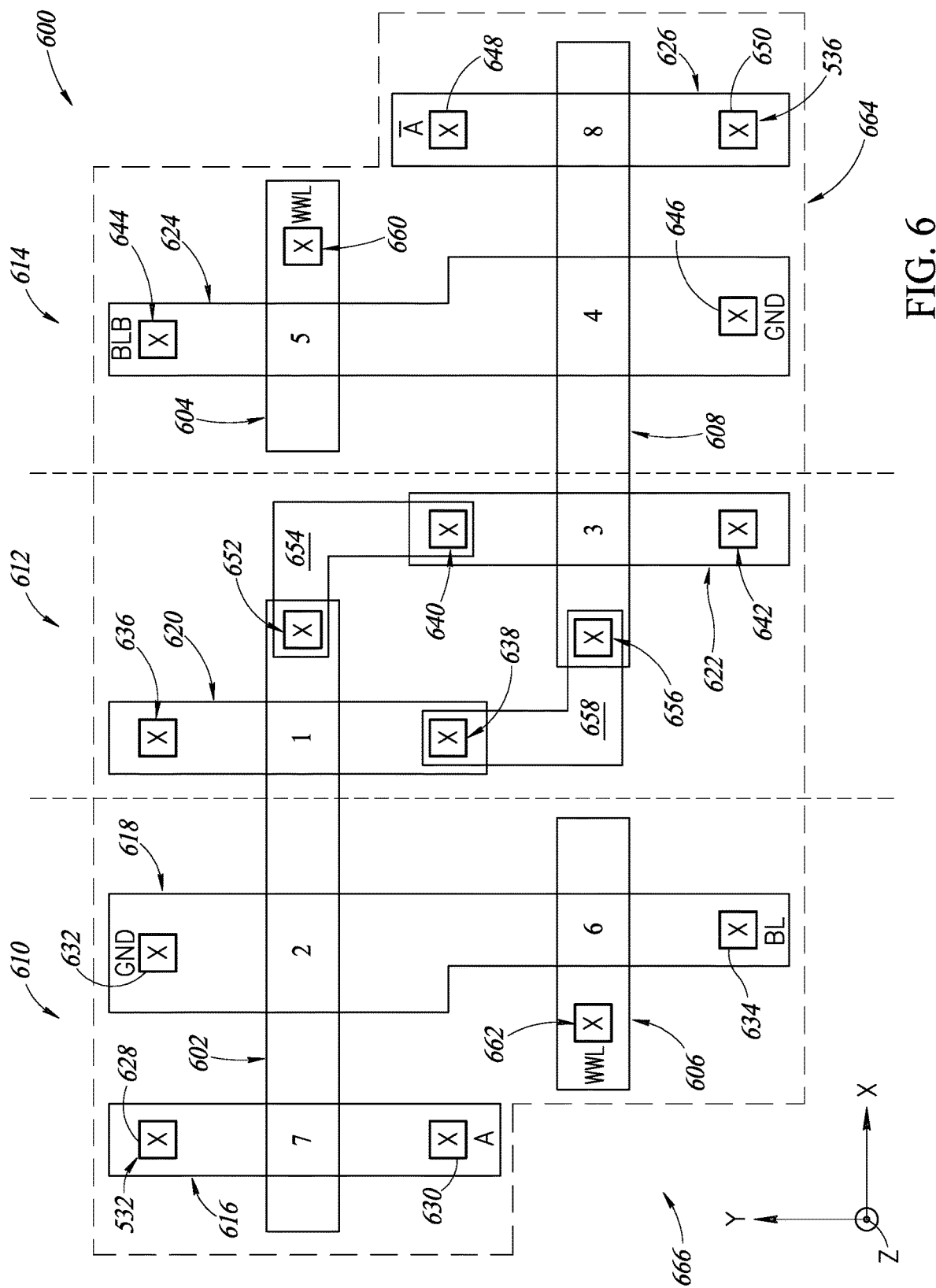
FIG. 6 shows a first layout of the memory cell of FIG. 5 according to one or more embodiments.

FIG. 6 shows a memory cell layout 600 of the SRAM cell 500 according to one or more embodiments. The memory cell layout 600 includes a plurality of active regions extending linearly in directions parallel to a first axis (parallel to the Y-axis in FIG. 6) and a plurality of gate regions extending linearly in directions transverse to the first axis (parallel to the ex-axis in FIG. 6). Each of the gate regions may be layers of polysilicon or a combination of polysilicon and other materials, as described above with respect to FIG. 2. The active regions are diffusion layers having up P-type or N-type depending on the desired operation of the SRAM cell 500. Some of the active regions and/or some of the gate regions may vary in width and/or thickness along their length.

The gate regions include a first set of gate regions extending along the first direction, including a first gate region 602 and a second gate region 604 extending along the first direction and being spaced apart from each other along the first direction. The gate regions also include a second set of gate regions extending along the first direction and being spaced apart from each other along the first direction. The second set of gate regions include a third gate region 606 and the fourth gate region 608 spaced apart from the third gate region 606. Although the gate regions are shown as being coaxial with each other, some of the gate regions may instead be misaligned with other gate regions without departing from the scope of the instant disclosure.

The active regions include a first set of active regions each extending in the second direction in a first area 610 of the memory cell layout 600, a second set of active regions each extending in the second direction in a second area 612 of the memory cell layout 600 that is adjacent to the first area 610, and the third set of active regions each extending the second direction and a third area 614 of the memory cell layout 600 that is adjacent to the second area 612. The first set of active regions include a first active region 616 and a second active region 618 extending in the first direction and being spaced apart from the first active region in the second direction. The second set of active regions includes a third active region 620 and a fourth active region 622 spaced apart from the third active region 620 and the second direction. The third set of active regions include a fifth active region 624 and a sixth active region 626 spaced apart from the fifth active region 624 and the second direction.

Transistors are formed in the first memory cell layout 600 at locations where a gate region overlays with an active region. The first transistor of the first inverter 502 is formed at an overlay between the third active region 620 and the first gate region 602. The second transistor of the first inverter 502 is formed at an overlay between the second active region 618 and the first gate region 602. The third transistor of the second inverter 504 is formed at an overlay between the fourth active region 622 and the fourth gate region 608. The fourth transistor of the second inverter 104 is formed at an overlay between the fifth active region 624 and the fourth gate region 608. The fifth transistor 610 is formed at an overlay between the second gate region 604 and the fifth active region 624. The sixth transistor 112 is formed at an overlay between the third gate region 606 and the second active region 618. The seventh transistor 514 is formed at an overlay between the first gate region 602 and the first active region 616. The eighth transistor 516 is formed at an overlay between the fourth gate region 608 and the sixth active region 626.

The active regions and the gate regions may be coupled to various inputs and outputs described with respect to the SRAM cell 500. The first active region 616 includes a first end portion provided with a connection 628 corresponding to the first output node 532 of the SRAM cell 500, and includes a second end portion provided with a connection 630 corresponding to the third node 520. The first active region 616 may provide therefrom a signal corresponding to a first output at the first output node 532 via the connection 628. The first active region 616 may receive a signal corresponding to the second logic state A via the connection 630.

The second active region 618 includes a first end portion provided with a connection 632 for connecting to a ground GND of the memory cell 500; however, the connection 632 may connect to a voltage supply (e.g., +5V) in some embodiments. The second active region 618 further includes a second end portion provided with a connection 634 for connecting to a bit line BL (or a complementary bit line BLB in some embodiments).

The third active region 620 includes a first end portion having a connection 636 for connecting to a voltage supply VDD and a second end portion having a connection 638 for coupling to the fourth gate region 608. The fourth active region 622 includes a first end portion having a connection 640 coupling to the first gate region 602 and includes a second end portion having a connection 638 for connecting to a voltage supply VDD.

The fifth active region 624 includes a first end portion provided with a connection 644 for connecting to a complementary bit line BLB (or a bit line BL in some embodiments). The fifth active region 624 also includes a second end portion with a connection 646 for connecting to a ground GND of the memory cell 500 (or a voltage supply VDD in some embodiments).

The sixth active region 626 includes a first end portion provided with a connection 648 corresponding to the fourth node 524, and includes a second end portion provided with a connection 650 corresponding to the second output node 536 of the SRAM cell 500. The sixth active region 626 may provide therefrom a signal corresponding to a second output at the second output node 536 via the connection 650. The sixth active region 626 may receive a signal corresponding to the complementary second logic state $\overline{A}$ via the connection 648.

The first gate region 602 has a first end portion with a connection 652 that is coupled with the connection 640 of the fourth active region 622 via a metal portion 654. The fourth gate region 608 has a first end portion with a connection 656 coupled to the connection 638 of the third active region 620 via a metal portion 658. As described above with respect to the layouts of the memory cell 100, the metal portions 654 and 658 may be located on a different layer than the active regions into different layer than the date regions.

The second gate region 604 includes a first end portion with a connection 664 connecting to the word write line WWL. The third gate region 606 includes a connection 662 at a first end portion thereof to connect to the word write line WWL.

The layouts 600 has a border 664 defining outermost edges of the SRAM cell 500. The border 664 has an asymmetrical shape with an end portions each having an L-shape vertically transposed with respect to the other end portion. In particular, the first area 610 defines a first end portion of the layout 600 and has a first recessed portion 666 that recesses inwardly from a left side and a bottom side of the layout 600. The third area 614 defines a second end portion of the layout 600 and has a second recessed portion 668 that recesses inwardly from a right side and an upper side of the layout 600. The first area 610 and the third area 614 are separated from each other by the second area 612 of the layout 600.

Figure 7:
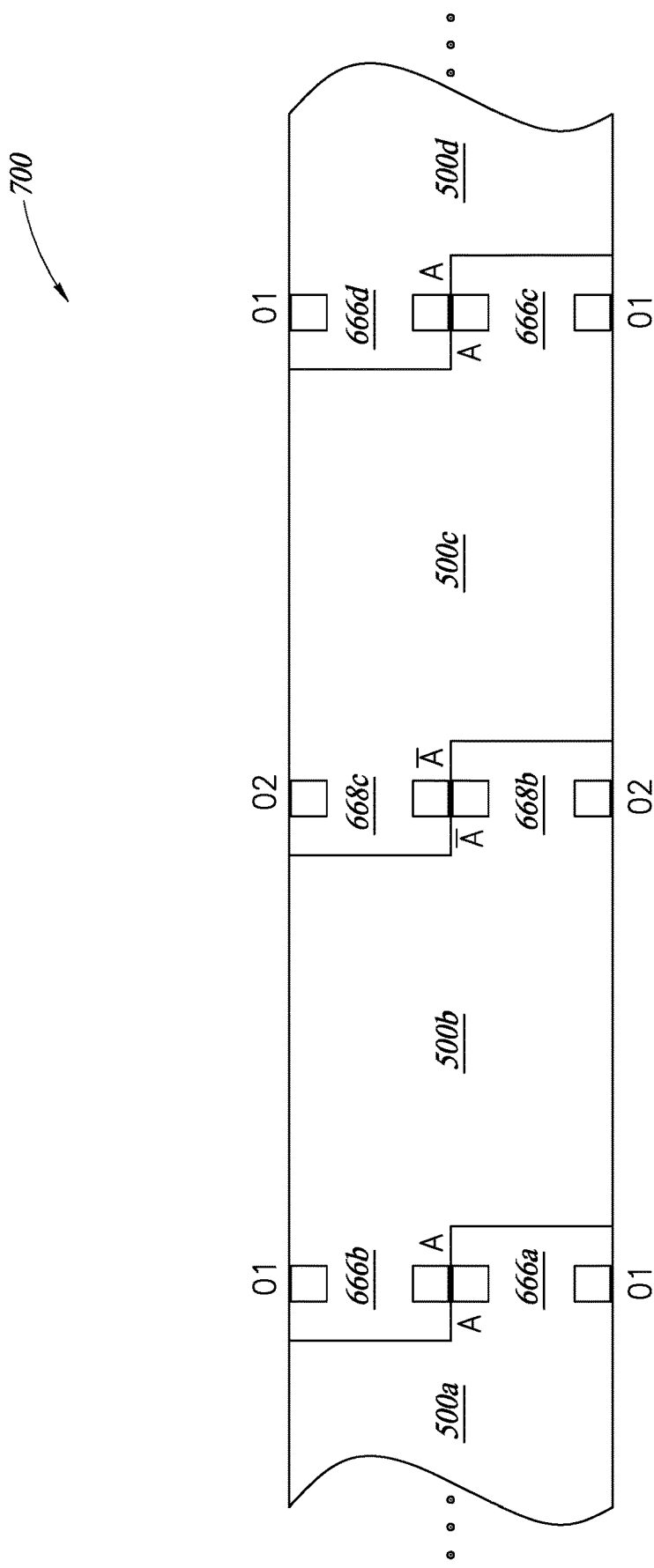
FIG. 7 shows an interconnection of memory cells of FIG. 5 according to one or more embodiments.

The connection 630 of the first active region and the connection 662 of the third gate region 606 are adjacent to the first recessed portion 666 for interfacing with corresponding connections of an adjacent memory cell layout, as described below with respect to FIG. 7. The connection 630 and the connection 662 may be exposed at the border 664 within the first recessed portion 666 for common connection of a signal line with the corresponding adjacent connection.

The connection 648 of the sixth active region 626 and the connection 660 of the second gate region 604 are adjacent to the second recessed portion 668 for interfacing with corresponding connections of an adjacent memory cell layout. The connection 648 and the connection 660 may be exposed at the border 664 within the second recessed portion 668 for common connection of a signal line with the corresponding adjacent connection. It is noted that end portions of some regions may be transposed from what is shown in FIG. 6 to provide different interconnections of nodes of the SRAM cell 500. For instance, the first end portion of the first active region 616 may be transposed with the second end portion thereof such that the connection 628 for providing a first output from the SRAM cell 500 may be located at or adjacent to the first recessed portion 666.

The shape of the border 664 of the SRAM cell layout 600 enables connection with adjacent memory cell layouts to facilitate sequential connection of memory cells, which increases density of memory cells in comparison with at least some previous implementations. FIG. 7 shows a diagram 700 illustrating interconnection of a plurality of SRAM cells 500 each having the memory cell layout 600 described above with respect to FIG. 6. The plurality of SRAM cells 500 includes a first memory cell 500a having a first recessed portion 666a engaged with a first recessed portion 666b of a second memory cell 500b. The second memory cell 500b has a second end portion 668b engaged with a second end portion 668c of a third memory cell 500c. The third memory cell 500c has a first end portion 666c engaged with a first end portion 666d of a fourth memory cell 500d, and so on. The plurality of memory cells 500a, . . . , 500d may include more than or fewer than four cells.

The plurality of memory cells 500a, . . . , 500d may be part of a neural network or other machine learning system in which bits of data are combined to generate output. For instance, the first output nodes 532 of the plurality of memory cells 500a, . . . , 500d may be collectively coupled to a first input of a sensing amplifier and the second output nodes 536 of the plurality of memory cells 500a, . . . , 500d may be collectively coupled to a second input of the sensing amplifier, which then provides an output based on a differential between the first input and the second input. As another example, the first output nodes 532 and the second output nodes 536 of each of the plurality of memory cells 500a, . . . , 500d may be coupled together and provided to a first input of a sensing amplifier. A second input of the sensing amplifier may be coupled to a reference voltage, in the sensing amplifier may provide an output based on a differential between the commonly coupled output nodes and the reference voltage.

Figure 8:
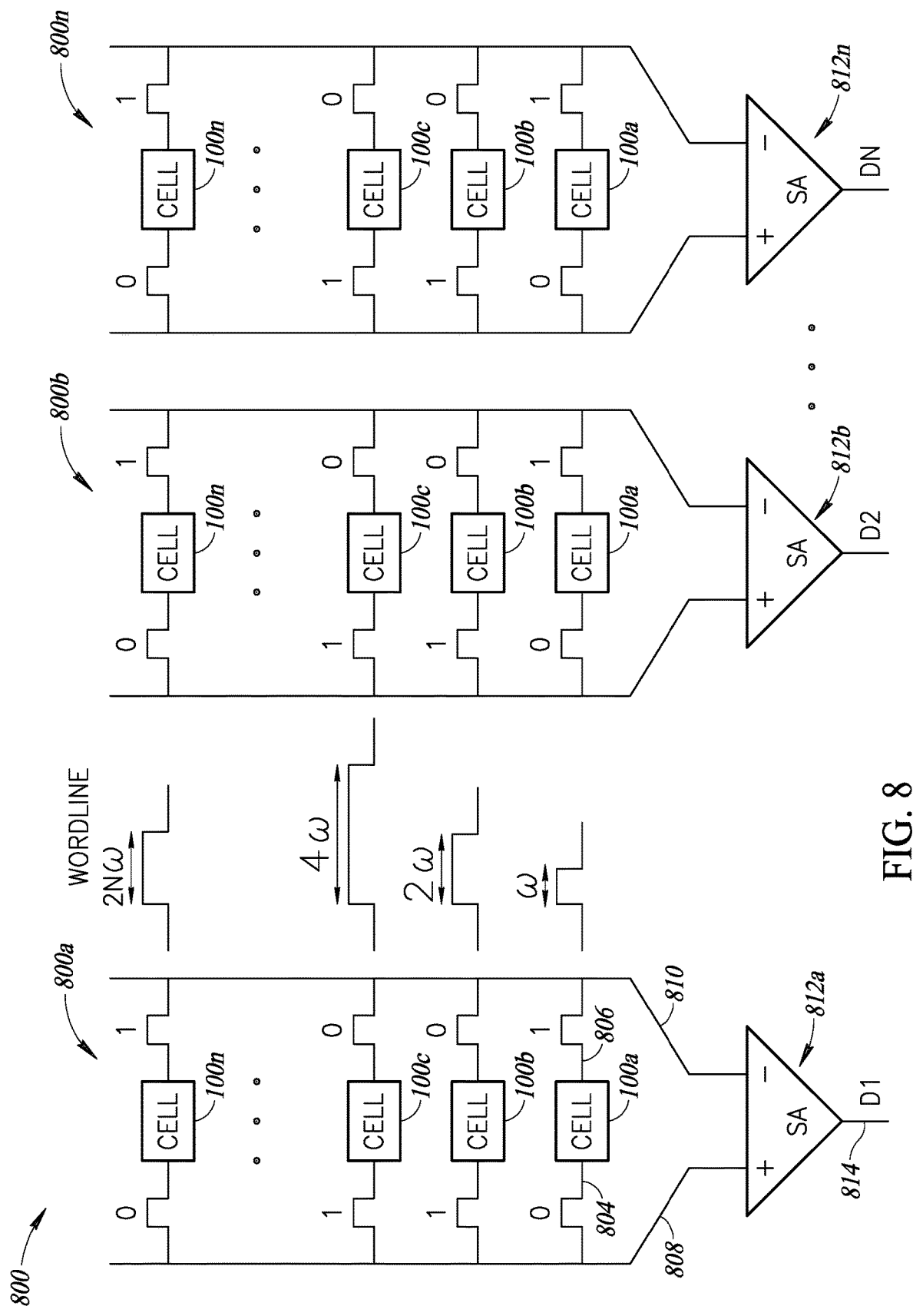
FIG. 8 shows a neural network that includes a plurality of memory cell networks each comprising memory cells according to one or more embodiments.

FIG. 8 shows a diagram of a neural network 800 according to one or more embodiments. The neural network 800 includes a plurality of memory cell networks 802a, 802b, . . . , 802N. Each network 802 includes a set of memory cells 100a, 100b, 100c, . . . , 100N arranged in parallel with each other. Each cell 100 has a first cell output 804 connected to a first sensing line 808 that is coupled to a first input terminal of the sensing amplifier 812. Each cell 100 may also have a second cell output 806 connected to a second sensing line 810 that is coupled to a second input terminal of the sensing amplifier 812. Each of the memory cell networks 802a, 802b, . . . 800N provides an independent output 814 corresponding to a bit of data for the neural network 800.

In the embodiment shown in FIG. 8, the sensing amplifiers 812 are operating in differential mode. In embodiments where the sensing amplifier is operating in single ended mode, a reference voltage may be connected to one of the input terminals of the sensing amplifier 812 and the first sensing line 808 is connected to the other one of the input terminals of the sensing amplifier 812.

The first cell output 804 of each memory cell 100 corresponds to a first set of outputs selected from the first output node 122, the second output node 124, the third output node 126, and the fourth output node 128. The second cell output 806 of each memory cell 100 corresponds to a second set of outputs selected from the first output node 122, the second output node 124, the third output node 26, and the fourth output node 120.

As one non-limiting example, the first cell output 804 may be an output corresponding to a commonly coupled first output node 122 and fourth output node 128 to provide a result of an XOR operation performed via in-memory compute by the memory cell 100. The second cell output 806 may be an output corresponding to a commonly coupled second output node 124 and third output node 126 to provide a result of an XNOR operation performed via in-memory compute by the memory cell 100.

As an example of a differential XOR output, the first cell output 804 may be an output corresponding to the first output node 122 and the second cell output 806 may be an output corresponding to the fourth output node 124. As an example of a differential XNOR output, the first cell output 804 may be an output corresponding to the second output node 124 and the second cell output 806 may be an output corresponding to the third output node 126.

Adaptability between both differential single-ended modes, as well as different logical operations (e.g., XNOR, XOR, NAND), increases the dynamic range of operation of the neural network 800.

The sensing amplifier 812 may perform differential read operations on the first sensing line 808 to determine results of operations performed by the set of memory cells 100a, 100b, 100c, . . . 100N coupled thereto. The sense amplifier 812 may also be configured to perform single-ended operations to determine results of in-memory computations performed by the set of memory cells 100a, 100b, 100c, . . .

100N coupled thereto. The sense amplifier 812 is able to detect small swing voltage differentials in signals provided thereto, which reduces the amount of power consumed in connection with in-memory compute operations.

Each network of the plurality of memory cell networks 802a, 802b, . . . , 802N may respectively determine a data output 814 based on the first cell output 804 and the second cell output 806 of each memory cell 100. Each sense amplifier 812 may, for example, detect a small swing difference between the first sensing line 808 and the second sensing line 810 to determine a voltage change that corresponds to the appropriate output to provide. This determination may involve consideration of the signal provided on the word line WL for the set of memory cells 100a, 100b, 100c, . . . 100N.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A neural network, comprising:
a plurality of memory cell networks, each memory cell network including:
a set of memory cells coupled together in parallel, wherein the memory cells of the set of memory cells respectively include:
a first inverter having a first input and a first output;
a second inverter having a second input coupled to the first output at a first node of the memory cell and a second output coupled to the first input at a second node of the memory cell;
a first transistor having a first terminal coupled to the first node and a gate coupled to a word line node;
a second transistor having a first terminal coupled to the second node and a gate coupled to the word line node;
a third transistor having a first terminal coupled to a first output node of the memory cell, a second terminal coupled to a third node of the memory cell, and a gate coupled to the first node;
a fourth transistor having a first terminal coupled to a second output node of the memory cell, a second terminal coupled to a fourth node of the memory cell, and a gate coupled to the second node;
a fifth transistor having a first terminal coupled to the third node, a second terminal coupled to a third output node of the memory cell, and a gate coupled to the second node; and
a sixth transistor having a first terminal coupled to the fourth node, a second terminal coupled to a fourth output node of the memory cell, and a gate coupled to the first node; and
amplifier circuitry that provides a data output of the memory cell network based on a set of signals received from output nodes of the set of memory cells that correspond to one or more nodes of the first output node, the second output node, the third output node, and the fourth output node, wherein, in operation, the data output of the memory cell network corresponds to a bit of data of the neural network.

2. The neural network of claim 1, wherein the first output node is coupled to the second output node external to the memory cell to provide a first logic output involving a logic state of the first output node and a logic state of the fourth output node, and the output of the amplifier circuitry is based on the logic output.

3. The neural network of claim 2, wherein the first logic output is a result of an exclusive OR operation involving the logic state of the first output node and the logic state of the fourth output node.

4. The neural network of claim 3, wherein the second output node is coupled to the third output node to provide a second logic output involving a logic state of the second output node and a logic state of the third output node, and the output of the amplifier circuitry is based on the second logic output.

5. The neural network of claim 2, wherein the second output node is coupled to the third output node to provide a second logic output involving a logic state of the second output node and a logic state of the third output node.

6. The neural network of claim 1, comprising:
a set of sense lines connected to the output nodes of the set of memory cells and connected to a set of inputs of the amplifier circuitry.

7. The neural network of claim 1, wherein the amplifier circuitry detects a small swing difference for the set of signals and generates the data output based on the small swing difference.

8. The neural network of claim 1, wherein the set of memory cells includes a first memory cell and a second memory cell, the first memory cell having a first end with an L-shape engaging an L-shape of a corresponding first end of the second memory cell.

9. The neural network of claim 8, wherein the third node of the first memory cell is coupled to the third node of the second memory cell.

10. The neural network of claim 8, wherein the set of memory cells includes a third memory cell having a second end with an L-shape, the second end of the third memory cell being engaged with an L-shape of a second end of the second memory cell.

11. A method, comprising:
storing, in a first set of transistors of a memory cell, a first logic state at a first node of the memory cell and a complimentary first logic state at a second node of the memory cell, the first node being gate coupled to a second set of transistors of the memory cell and the second node being gate coupled to a third set of transistors of the memory cell;
driving a second logic state at a third node of the memory cell and a complimentary second logic state at a fourth node of the memory cell, the third node being on a line coupling a first conductive terminal of a first transistor of the second set of transistors to a first conductive terminal of a first transistor of the third set of transistors and the fourth node being on a line coupling a first conductive terminal of a second transistor of the second set of transistors to a first conductive terminal of a second transistor of the third set of transistors; and
generating a set of outputs of the memory cell at a second conductive terminal of the first transistor of the second set of transistors, a second conductive terminal of the first transistor of the third set of transistors, a second conductive terminal of the second transistor of the second set of transistors, and a second conductive terminal of the second transistor of the third set of transistors.

12. The method of claim 11, comprising:
generating a data output using an amplifier coupled to the sets of outputs of the memory cell.

13. The method of claim 12, comprising coupling the amplifier to sets of outputs of a plurality of memory cells, wherein the data output is based on the sets of outputs of the plurality of memory cells.

14. A memory cell, comprising:
a first set of transistors;
a first node;
a second node, wherein the first set of transistors, in operation, store a first logic state at the first node and a complimentary first logic state at the second node;
a second set of transistors gate coupled to the first node;
a third set of transistors gate coupled to the second node;
a third node on a line coupling a first conductive terminal of a first transistor of the second set of transistors to a first conductive terminal of a first transistor of the third set of transistors, wherein the first transistor of the second set of transistors and the first transistor of the third set of transistors, in operation, drive a second logic state at the third node;
a fourth node on a line coupling a first conductive terminal of a second transistor of the second set of transistors to a first conductive terminal of a second transistor of the third set of transistors, wherein the second transistor of the second set of transistors and the second transistor of the third set of transistors, in operation, drive a complimentary second logic state at the fourth node; and
a set of outputs of the memory cell, the set of outputs including an output at a second conductive terminal of the first transistor of the second set of transistors, an output at a second conductive terminal of the first transistor of the third set of transistors, an output at a second conductive terminal of the second transistor of the second set of transistors, and an output at a second conductive terminal of the second transistor of the third set of transistors.

15. The memory cell of claim 14, comprising:
an amplifier coupled to the set of outputs of the memory cell, wherein the amplifier, in operation, generates a data output based on swing values at one or more outputs of the set of outputs.

16. The memory cell of claim 15, wherein the amplifier is coupled to a second set of outputs of a second memory cell, wherein the amplifier, in operation, generates the data output based on swing values at one or more outputs of the second set of outputs of the second memory cell.

17. A neural network, comprising:
a first plurality of memory cells, each memory cell of the first plurality of memory cells including:
a first set of transistors;
a first node;
a second node, wherein the first set of transistors, in operation, store a first logic state at the first node and a complimentary first logic state at the second node;
a second set of transistors gate coupled to the first node;
a third set of transistors gate coupled to the second node;
a third node on a line coupling a first conductive terminal of a first transistor of the second set of transistors to a first conductive terminal of a first transistor of the third set of transistors, wherein the first transistor of the second set of transistors and the first transistor of the third set of transistors, in operation, drive a second logic state at the third node;
a fourth node on a line coupling a first conductive terminal of a second transistor of the second set of transistors to a first conductive terminal of a second transistor of the third set of transistors, wherein the second transistor of the second set of transistors and the second transistor of the third set of transistors, in operation, drive a complimentary second logic state at the fourth node; and
a set of outputs of the memory cell, the set of outputs including an output at a second conductive terminal of the first transistor of the second set of transistors, an output at a second conductive terminal of the first transistor of the third set of transistors, an output at a second conductive terminal of the second transistor of the second set of transistors, and an output at a second conductive terminal of the second transistor of the third set of transistors; and
an amplifier coupled to the sets of outputs of the first plurality of memory cells, wherein the amplifier, in opration, generates a first data output of the neural network based on values at one or more outputs of the sets of outputs of the first plurality of memory cells.

18. The neural network of claim 17, comprising:
a second plurality of memory cells, each memory cell of the second plurality of memory cells including:
a first set of transistors;
a first node;
a second node, wherein the first set of transistors, in operation, store a first logic state at the first node and a complimentary first logic state at the second node;
a second set of transistors gate coupled to the first node;
a third set of transistors gate coupled to the second node;
a third node on a line coupling a first conductive terminal of a first transistor of the second set of transistors to a first conductive terminal of a first transistor of the third set of transistors, wherein the first transistor of the second set of transistors and the first transistor of the third set of transistors, in operation, drive a second logic state at the third node;
a fourth node on a line coupling a first conductive terminal of a second transistor of the second set of transistors to a first conductive terminal of a second transistor of the third set of transistors, wherein the second transistor of the second set of transistors and the second transistor of the third set of transistors, in operation, drive a complimentary second logic state at the fourth node; and
a set of outputs of the memory cell, the set of outputs including an output at a second conductive terminal of the first transistor of the second set of transistors, an output at a second conductive terminal of the first transistor of the third set of transistors, an output at a second conductive terminal of the second transistor of the second set of transistors, and an output at a second conductive terminal of the second transistor of the third set of transistors; and
a second amplifier coupled to the sets of outputs of the second plurality of memory cells, wherein the second amplifier, in operation, generates a second data output of the neural network based on values at one or more outputs of the sets of outputs of the second plurality of memory cells.

19. The neural network of claim 18, wherein the first data output is a first bit of data of the neural network and the second data output is a second bit of data of the neural network.

20. The neural network of claim 17, wherein the amplifier is a differential sense amplifier.

\* \* \* \* \*

UNITED STATES PATENT AND TRADEMARK OFFICE
CERTIFICATE OF CORRECTION

| | | |
|---|---|---|
| PATENT NO. | : 11,798,615 B2 | Page 1 of 1 |
| APPLICATION NO. | : 17/721956 | |
| DATED | : October 24, 2023 | |
| INVENTOR(S) | : Anuj Grover et al. | |

It is certified that error appears in the above-identified patent and that said Letters Patent is hereby corrected as shown below:

In the Claims

<u>Column 20, Claim 17, Line 20:</u>
"opration," should read: --operation,--.

Signed and Sealed this
Fifth Day of December, 2023

Katherine Kelly Vidal
*Director of the United States Patent and Trademark Office*